(12) United States Patent
Dijksman et al.

(10) Patent No.: US 7,943,080 B2
(45) Date of Patent: May 17, 2011

(54) ALIGNMENT FOR IMPRINT LITHOGRAPHY

(75) Inventors: Johan Frederik Dijksman, Weert (NL); Raymond Jacobus Knaapen, Helmond (NL); Krassimir Todorov Krastev, Eindhoven (NL); Sander Frederik Wuister, Eindhoven (NL); Yvonne Wendela Kruijt-Stegeman, Eindhoven (NL); Ivar Schram, Weert (NL)

(73) Assignee: ASML Netherlands B.V., Veldhoven (NL)

( * ) Notice: Subject to any disclaimer, the term of this patent is extended or adjusted under 35 U.S.C. 154(b) by 1318 days.

(21) Appl. No.: 11/316,361

(22) Filed: Dec. 23, 2005

(65) Prior Publication Data

US 2007/0145643 A1 Jun. 28, 2007

(51) Int. Cl.
*B29C 35/08* (2006.01)
*B29C 59/02* (2006.01)
*B29C 41/00* (2006.01)

(52) U.S. Cl. .......... 264/496; 425/385; 264/293; 264/85; 264/320; 977/877; 977/888

(58) Field of Classification Search .................. 264/496, 264/293, 85, 320; 425/385; 977/887, 888
See application file for complete search history.

(56) References Cited

U.S. PATENT DOCUMENTS

| | | | |
|---|---|---|---|
| 3,652,274 A * | 3/1972 | Verelst et al. | 430/310 |
| 5,487,967 A | 1/1996 | Hutton et al. | 430/322 |
| 5,550,007 A | 8/1996 | Taylor et al. | 430/314 |
| 5,817,242 A | 10/1998 | Biebuyck et al. | 216/41 |
| 6,482,742 B1 | 11/2002 | Chou | |
| 6,929,762 B2 * | 8/2005 | Rubin | 264/40.1 |
| 7,027,156 B2 * | 4/2006 | Watts et al. | 356/401 |
| 7,418,902 B2 * | 9/2008 | Kruijt-Stegeman et al. | 101/485 |
| 2004/0014102 A1 * | 1/2004 | Chen et al. | 435/6 |
| 2004/0021254 A1 * | 2/2004 | Sreenivasan et al. | 264/406 |
| 2004/0023126 A1 * | 2/2004 | Mancini et al. | 430/5 |
| 2004/0124566 A1 | 7/2004 | Sreenivasan et al. | |
| 2004/0141163 A1 * | 7/2004 | Bailey et al. | 355/18 |

(Continued)

FOREIGN PATENT DOCUMENTS

EP   0 628 879   8/1997

(Continued)

OTHER PUBLICATIONS

K.E. Uhrich, Formation of polymers Containg 4-hydroxystyrene via hydrolysis of 4-(Trimethylsiyl)oxy)styrene, Jule 15, 1994, Advance ACS Abstracts, pp. 4936-4940.*

(Continued)

*Primary Examiner* — Kat Wyrozebski
*Assistant Examiner* — Nahida Sultana
(74) *Attorney, Agent, or Firm* — Pillsbury Winthrop Shaw Pittman LLP

(57) ABSTRACT

A method of aligning an imprint template with respect to a target region of a substrate is disclosed, the method including depositing a volume of an imprintable medium within the target region; contacting an imprint template to the imprintable medium so that the imprintable medium is compressed and allowing the imprint template, the target region, or both, to move laterally with respect to each other under interfacial tension forces between the target region and the imprint template, wherein a material which is less wetting than the substrate is provided in a configuration which at least partially surrounds the target region of the substrate.

16 Claims, 7 Drawing Sheets

U.S. PATENT DOCUMENTS

| | | | |
|---|---|---|---|
| 2006/0127801 A1* | 6/2006 | Momose et al. | 430/270.1 |
| 2006/0255505 A1* | 11/2006 | Sandhu et al. | 264/293 |
| 2007/0176311 A1* | 8/2007 | Sawaishi et al. | 264/1.33 |
| 2007/0264481 A1* | 11/2007 | DeSimone et al. | 428/220 |
| 2009/0026657 A1* | 1/2009 | Nimmakayala et al. | 264/293 |
| 2009/0035668 A1* | 2/2009 | Breyta et al. | 430/18 |
| 2009/0057267 A1* | 3/2009 | Wuister et al. | 216/52 |
| 2010/0022676 A1* | 1/2010 | Rogers et al. | 522/20 |
| 2010/0063222 A1* | 3/2010 | Oikawa et al. | 525/474 |
| 2010/0084376 A1* | 4/2010 | Khusnatdinov et al. | 216/39 |
| 2010/0109203 A1* | 5/2010 | Chen et al. | 264/446 |

FOREIGN PATENT DOCUMENTS

| | | |
|---|---|---|
| JP | 9-511710 A | 11/1997 |
| JP | 09-312247 A | 12/1997 |
| WO | WO 97/06012 A1 | 2/1997 |
| WO | 2005/021156 A2 | 3/2005 |

OTHER PUBLICATIONS

U. Mock et al., "Drop Impact on Chemically Structured Arrays", Journal of Physics: Condensed Matter, vol. 17, pp. S595-S605, Feb. 18, 2005.

Official Action dated Mar. 17, 2009 issued in European Application No. 06 256 368.9-1226.

Notice of Reasons for Rejection for Japanese Patent Application No. 2006-337999 dated Oct. 26, 2009.

Jan Haisma, et al., "Mold-assisted nonolithography: A process for reliable pattern replication", J. Vac. Sci. Technol. B 14(6), pp. 4124-4128, (Nov./Dec. 1996).

Ameduri et al., "New Fluorinated Acrylic Monomers for the Surface Modification of UV-Curable Systems," Journal of Polymer Science, vol. 37, pp. 77-87 (1999).

European Search Report issued for European Patent Application No. 06256368.9-1226, dated Jun. 26, 2007.

* cited by examiner

ALIGNMENT FOR IMPRINT LITHOGRAPHY

1. FIELD

The present invention relates to alignment for imprint lithography.

2. BACKGROUND

A lithographic apparatus is a machine that applies a desired pattern onto a target portion of a substrate. Lithographic apparatus are conventionally used, for example, in the manufacture of integrated circuits (ICs), flat panel displays and other devices involving fine structures.

It is desirable to reduce the size of features in a lithographic pattern because this allows for a greater density of features on a given substrate area. In photolithography, the increased resolution may be achieved by using radiation of shorter wavelength. However, there are problems associated with such reductions. Current systems are starting to adopt optical sources with wavelengths in the 193 nm regime but even at this level, diffraction limitations become a barrier. At lower wavelengths, the transparency of materials is very poor. Optical lithography machines capable of enhanced resolutions require complex optics and rare materials and are consequently very expensive.

An alternative for printing sub-100 nm features, known as imprint lithography, comprises transferring a pattern to a substrate by imprinting a pattern into an imprintable medium using a physical mould or template. The imprintable medium may be the substrate or a material coated on to a surface of the substrate. The imprintable medium may be functional or may be used as a "mask" to transfer a pattern to an underlying surface. The imprintable medium may, for instance, be provided as a resist deposited on a substrate, such as a semiconductor material, into which the pattern defined by the template is to be transferred. Imprint lithography is thus essentially a moulding process on a micrometer or nanometer scale in which the topography of a template defines the pattern created on a substrate. Patterns may be layered as with optical lithography processes so that, in principle, imprint lithography could be used for such applications as IC manufacture.

The resolution of imprint lithography is limited only by the resolution of the template fabrication process. For instance, imprint lithography may be used to produce features in the sub-50 nm range with significantly improved resolution and line edge roughness compared to that achievable with conventional optical lithography processes. In addition, imprint processes do not require expensive optics, advanced illumination sources or specialized resist materials typically required by optical lithography processes.

Current imprint lithography processes can have one or more drawbacks as will be mentioned below, particularly with regard to achieving overlay accuracy and/or high throughput. However, significant improvement in resolution and line edge roughness attainable from imprint lithography is a strong driver for addressing those and other problems.

3. SUMMARY

According to a first aspect of the present invention, there is provided a method of aligning an imprint template with respect to a target region of a substrate, the method comprising: depositing a volume of an imprintable medium within the target region; contacting an imprint template to the imprintable medium so that the imprintable medium is compressed; and allowing the imprint template, the target region, or both, to move laterally with respect to each other under interfacial tension forces between the target region and the imprint template, wherein a material which is less wetting than the substrate is provided in a configuration which at least partially surrounds the target region of the substrate.

According to a second aspect of the present invention, there is provided a lithographic apparatus, comprising: a substrate table constructed to hold a substrate; and a template holder constructed to hold an imprint template, wherein the imprint template, the substrate, or both, are configured to be moveable laterally with respect to each other under the action of interfacial tension forces, arising from an imprintable medium to be provided between the substrate and the imprint template, until an equilibrium position is reached in which the interfacial tension forces substantially cancel each other out.

According to a third aspect of the present invention, there is provided a method of providing material on a substrate for use in imprint lithography, the material being less wetting than the substrate, the method comprising providing the substrate with a layer of polymer including a photo-acid generator, illuminating selected areas of the substrate with actinic radiation, and reacting the layer of polymer with a silicon containing substance to form anti-wetting material in the selected areas.

According to a fourth aspect of the present invention, there is provided a method of providing material on a substrate for use in imprint lithography, the material being less wetting than the substrate, the method comprising exposing the substrate to a monomer, and illuminating selected areas of the substrate with actinic radiation such that the monomer reacts with the substrate.

One or more embodiments of the present invention are applicable to any imprint lithography process in which a patterned template is imprinted into an imprintable medium in a flowable state, and for instance can be applied to hot and UV imprint lithography as described below.

4. BRIEF DESCRIPTION OF THE DRAWINGS

Embodiments of the invention will now be described, by way of example only, with reference to the accompanying schematic drawings in which corresponding reference symbols indicate corresponding parts, and in which.

Figure 3:
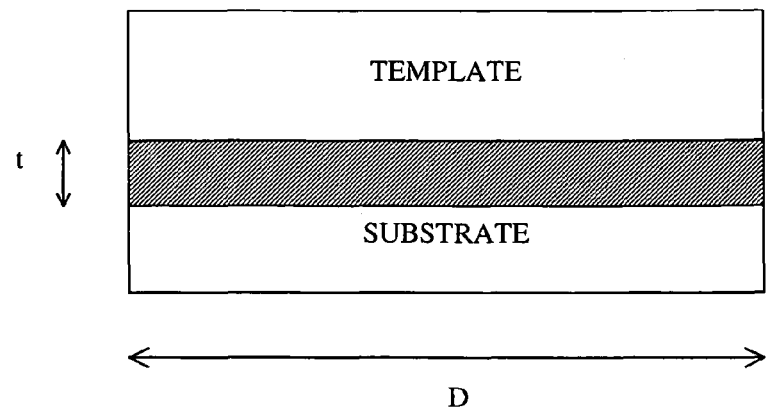
Figure 6:
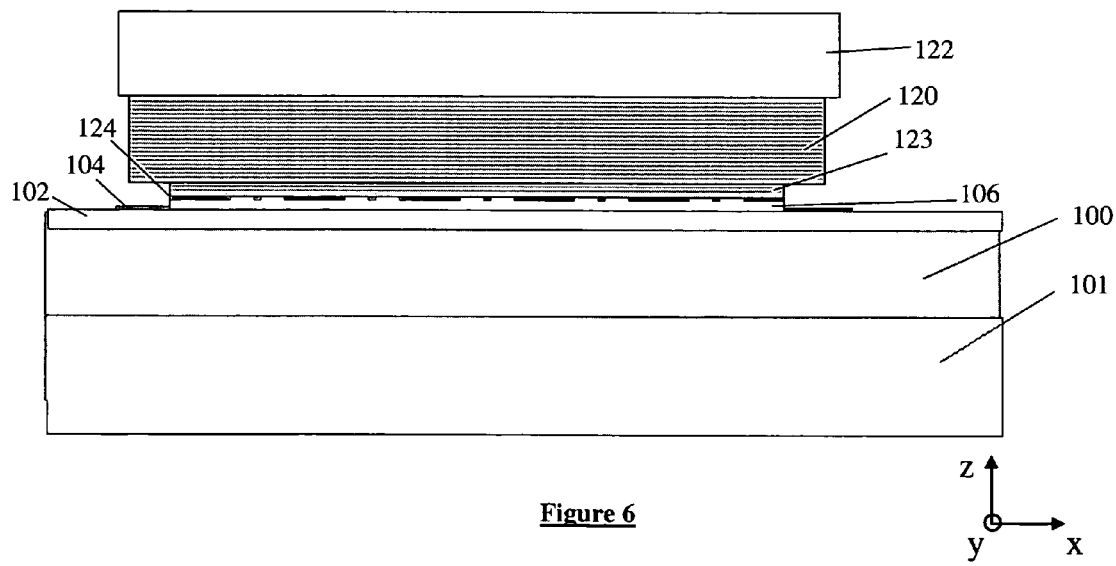
Figure 7:
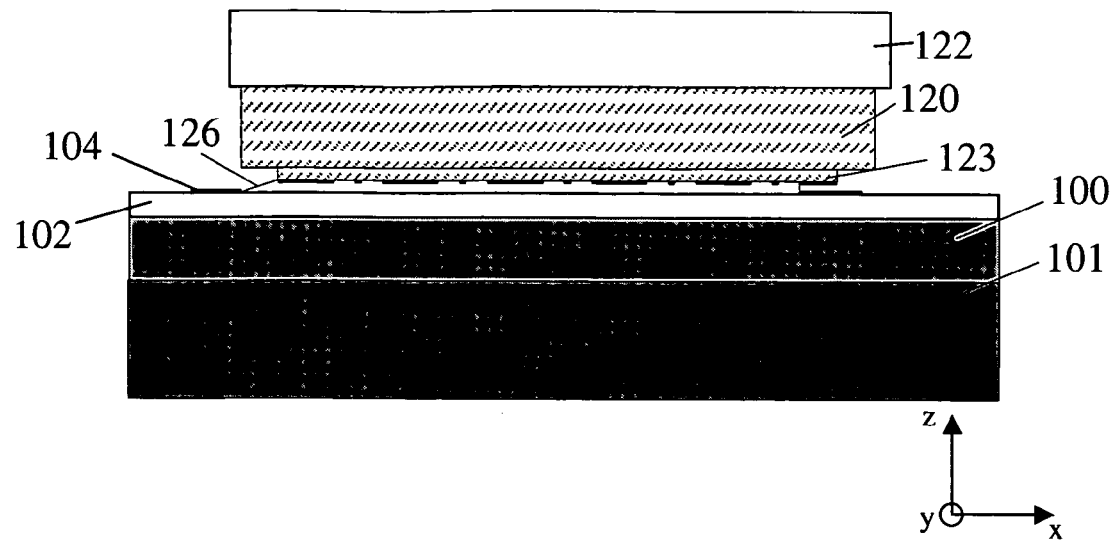
Figure 8:
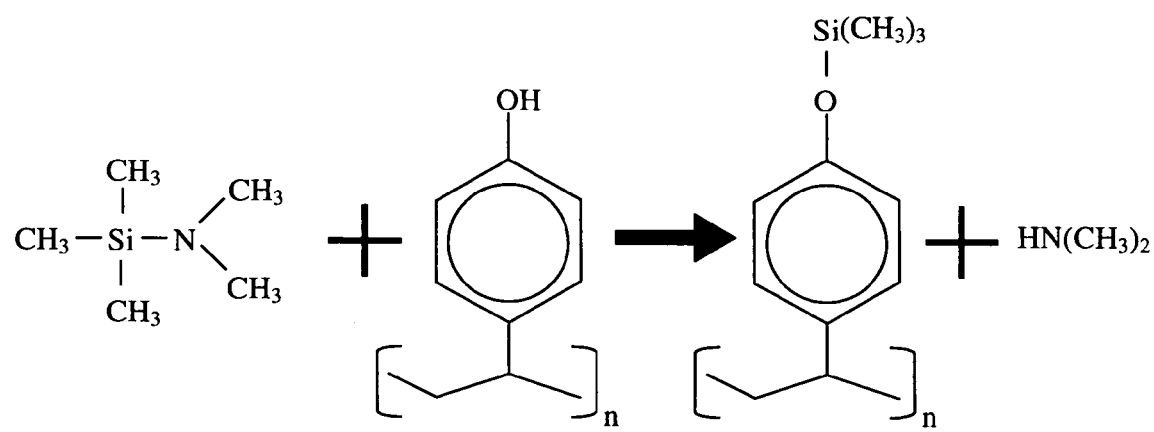

FIG. 3 schematically illustrates a template and a typical imprintable resist layer deposited on a substrate; and FIGS. 4 to 7 schematically represent imprinting a substrate provided with imprintable medium and with anti-wetting material, according to an embodiment of the invention; and FIG. 8 shows chemical reactions which are used in an embodiment of the invention to form the anti-wetting material.

5. DETAILED DESCRIPTION

There are two principal approaches to imprint lithography which will be termed generally as hot imprint lithography and UV imprint lithography. There is also a third type of "printing" lithography known as soft lithography. Examples of these are illustrated in FIGS. 1a to 1c.

Figure 1A:
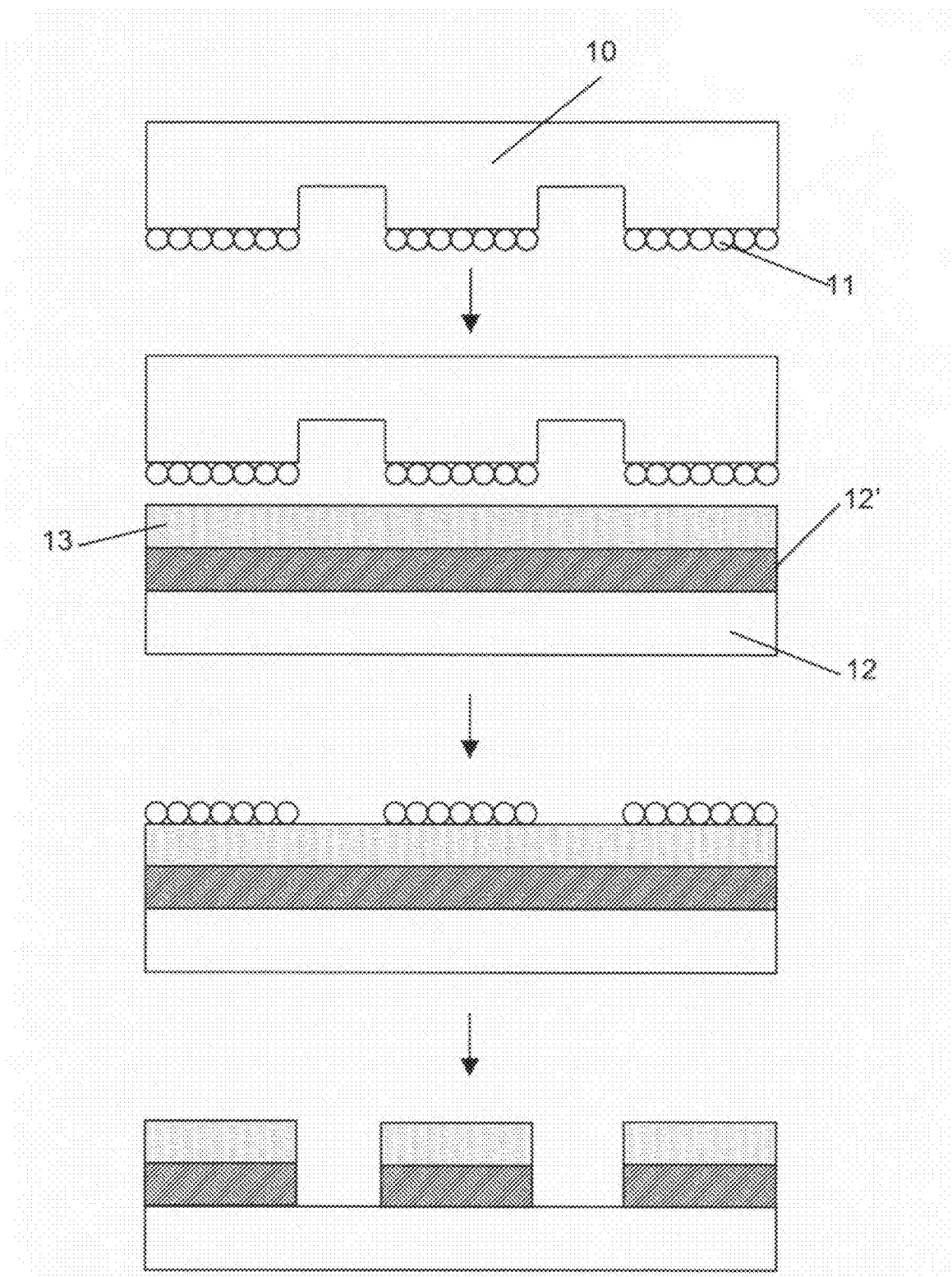
FIG. 1a-1c illustrate examples of conventional soft, hot and UV lithography processes respectively.
Figure 1B:
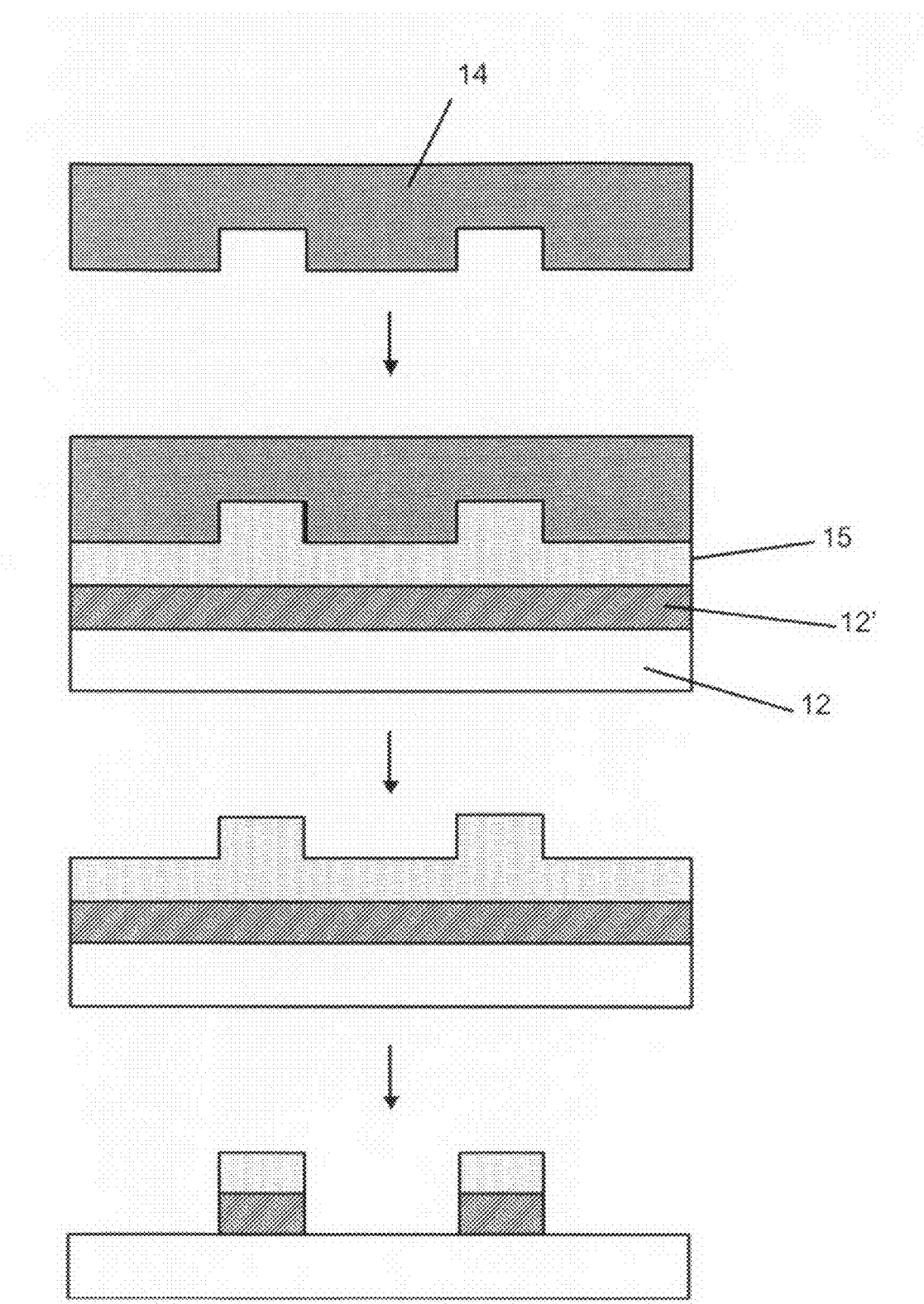
Figure 1C:
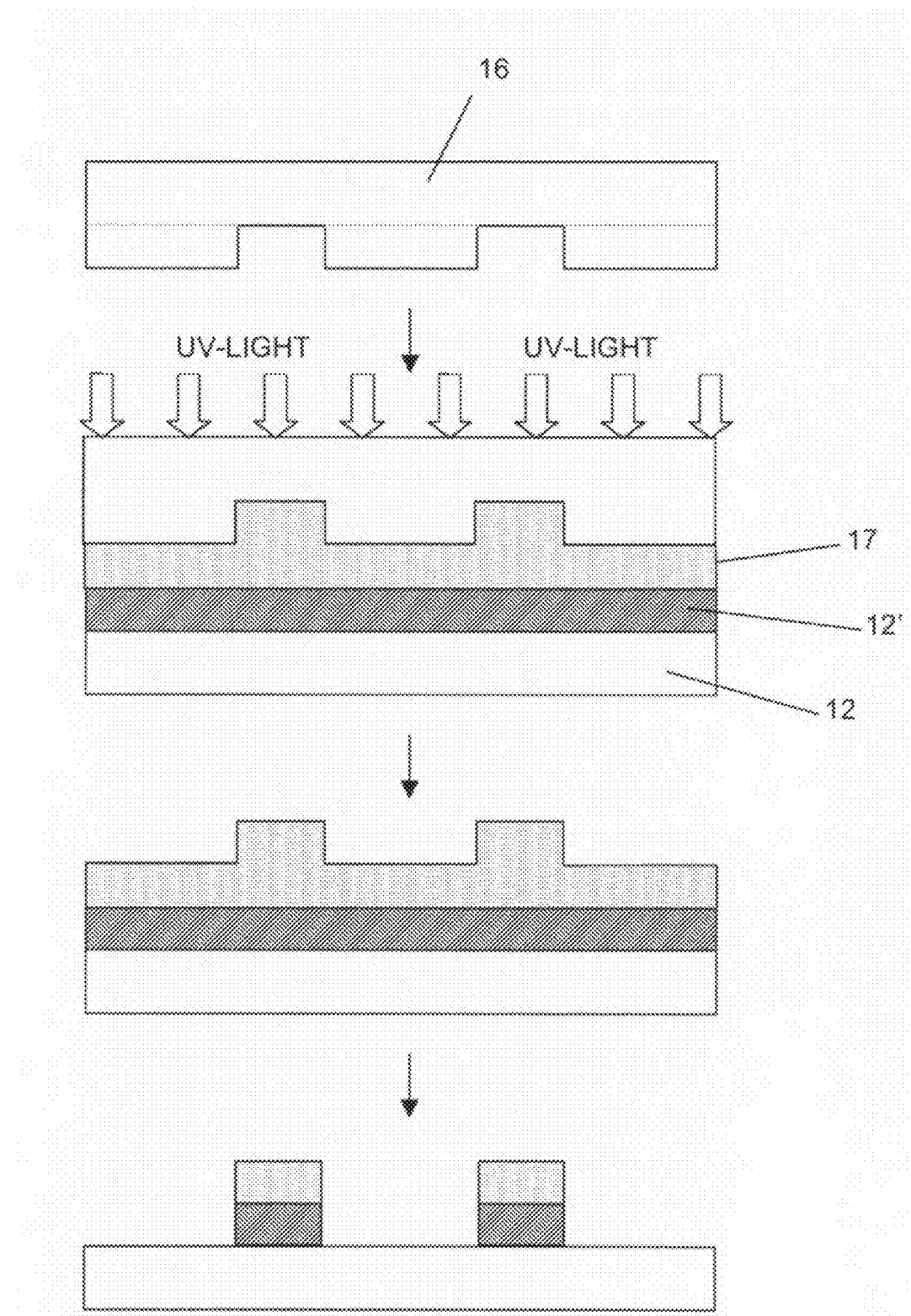

FIG. 1a schematically depicts the soft lithography process which involves transferring a layer of molecules 11 (typically an ink such as a thiol) from a flexible template 10 (typically fabricated from polydimethylsiloxane (PDMS)) onto a resist layer 13 which is supported upon a substrate 12 and planarization and transfer layer 12'. The template 10 has a pattern of features on its surface, the molecular layer being disposed upon the features. When the template is pressed against the resist layer, the layer of molecules 11 stick to the resist. Upon removal of the template from the resist, the layer of molecules 11 stick to the resist, the residual layer of resist is etched such that the areas of the resist not covered by the transferred molecular layer are etched down to the substrate.

The template used in soft lithography may be easily deformed and may therefore not be suited to high resolution applications, e.g. on a nanometer scale, since the deformation of the template may adversely affect the imprinted pattern. Furthermore, when fabricating multiple layer structures, in which the same region will be overlaid multiple times, soft imprint lithography may not provide overlay accuracy on a nanometer scale.

Hot imprint lithography (or hot embossing) is also known as nanoimprint lithography (NIL) when used on a nanometer scale. The process uses a harder template made from, for example, silicon or nickel, which are more resistant to wear and deformation. This is described for instance in U.S. Pat. No. 6,482,742 and illustrated in FIG. 1b. In a typical hot imprint process, a solid template 14 is imprinted into a thermosetting or a thermoplastic polymer resin 15, which has been cast on the surface of a substrate 12. The resin may, for instance, be spin coated and baked onto the substrate surface or more typically (as in the example illustrated) onto a planarization and transfer layer 12'. It should be understood that the term "hard" when describing an imprint template includes materials which may generally be considered between "hard" and "soft" materials, such as for example "hard" rubber. The suitability of a particular material for use as an imprint template is determined by its application requirements.

When a thermosetting polymer resin is used, the resin is heated to a temperature such that, upon contact with the template, the resin is sufficiently flowable to flow into the pattern features defined on the template. The temperature of the resin is then increased to thermally cure (e.g. crosslink) the resin so that it solidifies and irreversibly adopts the desired pattern. The template may then be removed and the patterned resin cooled.

Examples of thermoplastic polymer resins used in hot imprint lithography processes are poly(methyl methacrylate), polystyrene, poly(benzyl methacrylate) or poly (cyclohexyl methacrylate). The thermoplastic resin is heated so that it is in a freely flowable state immediately prior to imprinting with the template. It is typically necessary to heat thermoplastic resin to a temperature considerably above the glass transition temperature of the resin. The template is pressed into the flowable resin and sufficient pressure is applied to ensure the resin flows into all the pattern features defined on the template. The resin is then cooled to below its glass transition temperature with the template in place whereupon the resin irreversibly adopts the desired pattern. The pattern will consist of the features in relief from a residual layer of the resin which may then be removed by an appropriate etch process to leave only the pattern features.

Figure 2:
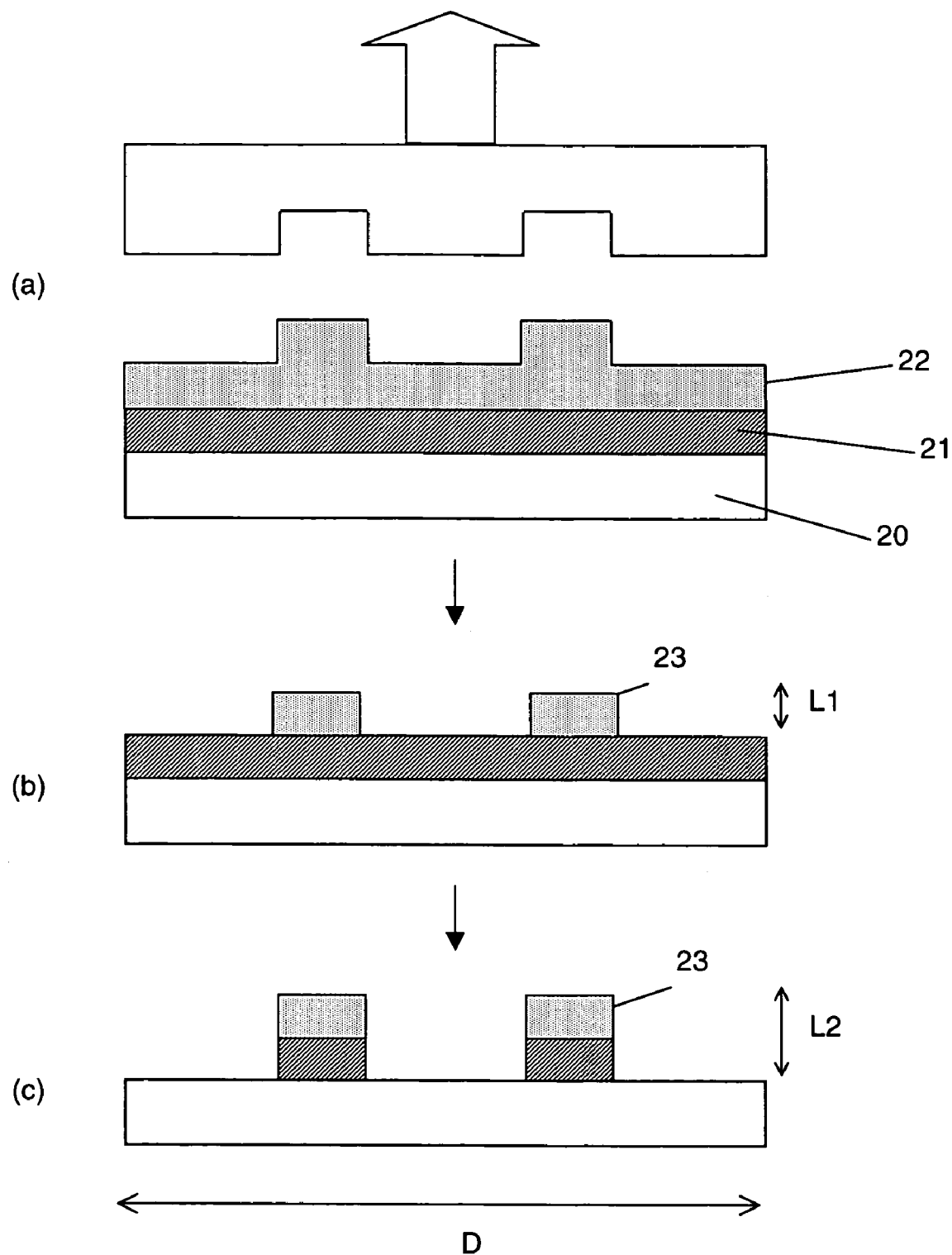
FIG. 2 illustrates a two step etching process employed when hot and UV imprint lithography is used to pattern a resist layer.

Upon removal of the template from the solidified resin, a two-step etching process is typically performed as illustrated in FIGS. 2a to 2c. The substrate 20 has a planarization and transfer layer 21 immediately upon it, as shown in FIG. 2a. The purpose of the planarization and transfer layer is twofold. It acts to provide a surface substantially parallel to that of the template, which helps ensure that the contact between the template and the resin is parallel, and also to improve the aspect ratio of the printed features, as described herein.

After the template has been removed, a residual layer 22 of the solidified resin is left on the planarization and transfer layer 21, shaped in the desired pattern. The first etch is isotropic and removes parts of the residual layer 22, resulting in a poor aspect ratio of features where L1 is the height of the features 23, as shown in FIG. 2b. The second etch is anisotropic (or selective) and improves the aspect ratio. The anisotropic etch removes those parts of the planarization and transfer layer 21 which are not covered by the solidified resin, increasing the aspect ratio of the features 23 to (L2/D), as shown in FIG. 2c. The resulting polymer thickness contrast left on the substrate after etching can be used as for instance a mask for dry etching if the imprinted polymer is sufficiently resistant, for instance as a step in a lift-off process.

Hot imprint lithography suffers from a disadvantage in that not only is the pattern transfer performed at a higher temperature, but also relatively large temperature differences might be required in order to ensure the resin is adequately solidified before the template is removed. Temperature differences between 35 and 100° C. may be needed. Differential thermal expansion between, for instance, the substrate and template may then lead to distortion in the transferred pattern. This may be exacerbated by the relatively high pressure needed for the imprinting step, due the viscous nature of the imprintable material, which can induce mechanical deformation in the substrate, again distorting the pattern.

UV imprint lithography, on the other hand, does not involve such high temperatures and temperature changes nor does it require such viscous imprintable materials. Rather, UV imprint lithography involves the use of a partially or wholly transparent template and a UV-curable liquid, typically a monomer such as an acrylate or methacrylate. for example. UV imprint lithography is discussed, for example, in J. Haisma "Mold-assisted nanolithography: A process for reliable pattern replication", J. Vac. Sci. Technol. B 14(6), November/December 1996. In general, any photopolymerizable material could be used, such as a mixture of monomers and an initiator. The curable liquid may also, for instance, include a dimethyl siloxane derivative. Such materials are less viscous than the thermosetting and thermoplastic resins used in hot imprint lithography and consequently move much faster to fill template pattern features. Low temperature and low pressure operation also favors higher throughput capabilities. Although the name 'UV imprint lithography' implies that UV radiation is always used, those skilled in the art will be aware that any suitable actinic radiation may be used (for example, visible light may be used). Hence, any reference herein to UV imprint lithography, UV radiation, UV curable materials, etc. should be interpreted as including any suitable actinic radiation, and should not be interpreted as being limited to UV radiation only.

An example of a UV imprint process is illustrated in FIG. 1c. A quartz template 16 is applied to a UV curable resin 17 in a similar manner to the process of FIG. 1b. Instead of raising the temperature as in hot embossing employing thermosetting resins, or temperature cycling when using thermoplastic resins, UV radiation is applied to the resin through the quartz template in order to polymerize and thus cure it. Upon removal of the template, the remaining steps of etching the residual layer of resist are the same or similar as for the hot embossing process described herein. The UV curable resins typically used have a much lower viscosity than typical thermoplastic resins so that lower imprint pressures can be used. Reduced physical deformation due to the lower pressures, together with reduced deformation due to high temperatures and temperature changes, makes UV imprint lithography suited to applications requiring high overlay accuracy. In addition, the transparent nature of UV imprint templates can accommodate optical alignment techniques simultaneously to the imprinting.

Although this type of imprint lithography mainly uses UV curable materials, and is thus generically referred to as UV imprint lithography, other wavelengths of radiation may be used to cure appropriately selected materials (e.g., activate a polymerization or cross linking reaction). In general, any radiation capable of initiating such a chemical reaction may be used if an appropriate imprintable material is available. Alternative "activating radiation" may, for instance, include visible light, infrared radiation, x-ray radiation and electron beam radiation. In the general description herein, references to UV imprint lithography and use of UV radiation are not intended to exclude these and other activating radiation possibilities.

As an alternative to imprint systems using a planar template which is maintained substantially parallel to the substrate surface, roller imprint systems have been developed. Both hot and UV roller imprint systems have been proposed in which the template is formed on a roller but otherwise the imprint process is very similar to imprinting using a planar template. Unless the context requires otherwise, references to an imprint template include references to a roller template.

There is a particular development of UV imprint technology known as step and flash imprint lithography (SFIL) which may be used to pattern a substrate in small steps in a similar manner to optical steppers conventionally used, for example, in IC manufacture. This involves printing small areas of the substrate at a time by imprinting a template into a UV curable resin, 'flashing' UV radiation through the template to cure the resin beneath the template, removing the template, stepping to an adjacent region of the substrate and repeating the operation. The small field size of such step and repeat processes may help reduce pattern distortions and CD variations so that SFIL may be particularly suited to manufacture of IC and other devices requiring high overlay accuracy. United States patent application publication US 2004-0124566 describes in detail an example of a step and flash imprint lithography apparatus.

Although in principle the UV curable resin can be applied to the entire substrate surface, for instance by spin coating, this may be problematic due to the volatile nature of UV curable resins.

One approach to addressing this problem is the so-called 'drop on demand' process in which the resin is dispensed onto a target portion of the substrate in droplets immediately prior to imprinting with the template. The liquid dispensing is controlled so that a certain volume of liquid is deposited on a particular target portion of the substrate. The liquid may be dispensed in a variety of patterns and the combination of carefully controlling liquid volume and placement of the pattern can be employed to confine patterning to the target area.

Dispensing the resin on demand as mentioned is not a trivial matter. The size and spacing of the droplets are carefully controlled to ensure there is sufficient resin to fill template features while at the same time minimizing excess resin which can be rolled to an undesirably thick or uneven residual layer since as soon as neighboring drops touch fluid, the resin will have nowhere to flow.

Although reference is made herein to depositing UV curable liquids onto a substrate, the liquids could also be deposited on the template and in general the same techniques and considerations will apply.

FIG. 3 illustrates the relative dimensions of the template, imprintable material (curable monomer, thermosetting resin, thermoplastic, etc) and substrate. The ratio of the width of the substrate, D, to the thickness of the curable resin layer, t, is of the order of 106. It will be appreciated that, in order to avoid the features projecting from the template damaging the substrate, the dimension t should be greater than the depth of the projecting features on the template.

The residual layer left after stamping is useful in protecting the underlying substrate, but as mentioned herein it may also be the source of a problem, particularly when high resolution and/or minimum CD (critical dimension) variation is desired. The first 'breakthrough' etch is isotropic (non-selective) and will thus to some extent erode the features imprinted as well as the residual layer. This may be exacerbated if the residual layer is overly thick and/or uneven. This problem may, for instance, lead to variation in the thickness of lines ultimately formed in the underlying substrate (i.e. variation in the critical dimension). The uniformity of the thickness of a line that is etched in the transfer layer in the second anisotropic etch is dependant upon the aspect ratio and integrity of the shape of the feature left in the resin. If the residual resin layer is uneven, then the non-selective first etch can leave some of these features with "rounded" tops so that they are not sufficiently well defined to ensure good uniformity of line thickness in the second and any subsequent etch process. In principle, the above problem may be reduced by ensuring the residual layer is as thin as possible but this can require application of undesirably large pressures (possibly increasing substrate deformation) and relatively long imprinting times (possibly reducing throughput).

The template is a significant component of the imprint lithography system. As noted herein, the resolution of the features on the template surface is a limiting factor on the attainable resolution of features printed on the substrate. The templates used for hot and UV lithography are generally formed in a two-stage process. Initially, the desired pattern is written using, for example, electron beam writing (e.g., with an electron beam pattern generator), to give a high resolution pattern in resist. The resist pattern is then transferred into a thin layer of chrome which forms the mask for the final, anisotropic etch step to transfer the pattern into the base material of the template. Other techniques such as for example ion-beam lithography, X-ray lithography, extreme UV lithography, epitaxial growth, thin film deposition, chemical etching, plasma etching, ion etching or ion milling could be used. Generally, a technique capable of very high resolution will be used as the template is effectively a 1× mask with the resolution of the transferred pattern being limited by the resolution of the pattern on the template.

The release characteristics of the template may also be a consideration. The template may, for instance, be treated with a surface treatment material to form a thin release layer on the template having a low surface energy (a thin release layer may also be deposited on the substrate).

Another consideration in the development of imprint lithography is the mechanical durability of the template. The template may be subjected to large forces during stamping of the resist, and in the case of hot lithography, may also be subjected to extremes of pressure and temperature. This may cause wearing of the template, and may adversely affect the shape of the pattern imprinted upon the substrate.

In hot imprint lithography, there is a potential advantage in using a template of the same or similar material to the substrate to be patterned in order to reduce differential thermal expansion between the two. In UV imprint lithography, the template is at least partially transparent to the activation radiation and accordingly quartz templates are used.

Although specific reference may be made in this text to the use of imprint lithography in the manufacture of ICs, it should be understood that imprint apparatus and methods described may have other applications, such as the manufacture of integrated optical systems, guidance and detection patterns for magnetic domain memories, hard disc magnetic media, flat panel displays, thin-film magnetic heads, etc.

While in the description herein, particular reference has been made to the use of imprint lithography to transfer a template pattern to a substrate via an imprintable resin effectively acting as a resist, in some circumstances the imprintable material may itself be a functional material, for instance having a functionally such as electrical or thermal conductivity, optical linear or non-linear response, among others. For example, the functional material may form a conductive layer, a semi-conductive layer, a dielectric layer or a layer having another desirable mechanical, electrical or optical property. Some organic substances may also be appropriate functional materials. Such applications may be within the scope an embodiment of the present invention.

Figure 4:
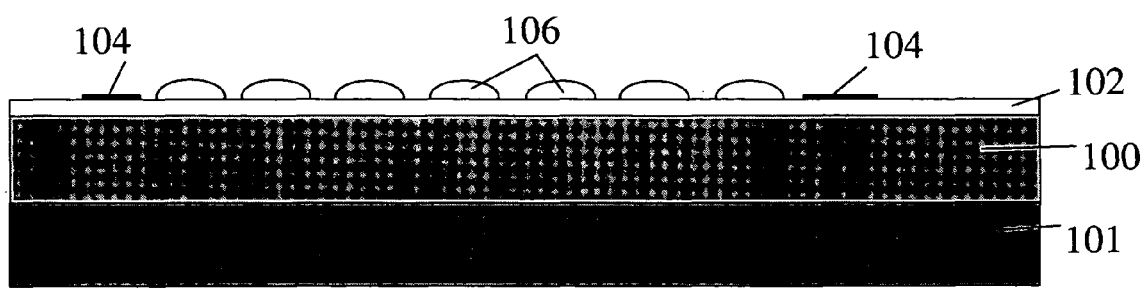

FIG. 4 shows schematically in cross section part of a substrate 100 which is supported by a substrate table 101. A planarization layer 102 comprising, for example, poly(methyl methacrylate) or polystyrene is provided on an upper surface of the substrate. The substrate 100 is provided with two areas of anti-wetting material 104, and an array of droplets of imprintable medium 106. The imprintable medium 106 is wetting with respect to the planarization layer 102.

Figure 5:
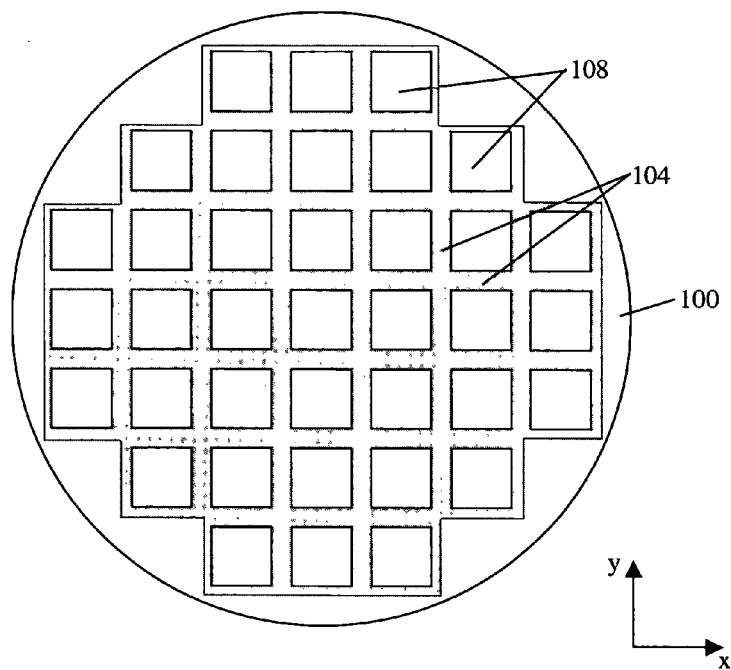

FIG. 5 is a schematic view from above the substrate 100. Thirty seven squares are shown on the substrate, each of which represents a target region 108 to be imprinted. The target regions 108 are surrounded by a grid of anti-wetting material 104 (the areas shown in FIG. 4 form part of this grid).

The grid of anti-wetting material 104 may be provided by grafting anti-wetting material molecules on top of the planarization layer 102 (the molecules may be, for example, (per)fluorinated acrylates). This may be achieved, for example, by placing the substrate 100 in an enclosed chamber and attaching the anti-wetting molecules at well-defined locations on the substrate by illuminating those locations using UV radiation. For example, a spot of UV radiation may be guided over the surface of the substrate 100 using a stored pattern which reflects the precise locations of the target regions 108. This may result in anti-wetting material 104 which is positioned with a precision better than 100 nm, better than 50 nm, or better than 10 nm. In some instances, a dual stage or multi stage system may be used, wherein measurement of the positions of the target regions 108 may occur at a first location within a lithographic apparatus, and imprinting of the substrate 100 may occur at a second location within the lithographic apparatus. Applying the anti-wetting material 104 may, for example, take place at the first location or the second location, or may take place at some other location which may also be within the lithographic apparatus.

The anti-wetting material 104 referred to above may be provided by illuminating a suitable material with UV radiation, then allowing the material to react with a silicon containing substance containing a group that provides a low surface energy.

In an embodiment, the substrate is spin-coated with a planarization layer containing a photo-acid generator. The planarization layer comprises a polymer with reactive groups that are blocked by a small molecular group. For example, the polymer poly(tert-butoxycarbonyl)-hydroxystyrene has reactive hydroxy (—OH) groups that are protected by tert-butoxycarbonyl groups. The selected areas of the polymer that are planned to be anti-wetting are illuminated with UV radiation, whereupon the photo-acid generator releases acid in the illuminated areas. The acid catalyzes the de-blocking of the small protective group (i.e. the tert-butoxycarbonyl group). This de-blocking takes place only in the regions that were illuminated, and yields reactive sites (—OH groups) in the polymer.

The reactive groups can react with molecules that contain at least (1) a capability of binding to the reactive groups of the planarization layer and (2) a group that provides a low surface energy i.e. has an anti-wetting character. An example of a suitable material is n-octadecyldimethyl(dimethylamino)silane. This molecule forms a covalent bond with the polymer and the octadecyl group provides a low surface tension, as depicted in FIG. 8. Also or alternatively, fluorinated alkyldimethyl(dimethylamino)silane may be used.

In an embodiment, a polymer with a photo-acid generator is spin-coated as a thin layer over an existing planarization layer, for example, poly(methyl methacrylate) or polystyrene. The thickness of the layer may be, for example, thinner than 50 nm.

The illumination used to form the anti-wetting material on the planarization layer may be performed, for example, using a laser writer. Alternatively, illumination through a photomask may be used.

The droplets of imprintable medium 106 may be provided by an array of dispensers, for example ink-jet nozzles. Alternatively, a single nozzle may be used. The droplets of imprintable medium 106 are shown in FIG. 4 as all having the same volume. However, in some instances the volume of the droplets may be adjusted to take account of locations in a pattern to be imprinted which require more imprintable medium than other locations.

Referring to FIG. 6, an imprint template 120 held by a template holder 122 is located over the substrate 100. The imprint template is provided with a raised patterned portion 123 (referred to as the mesa). The raised patterned portion 123 of the imprint template 120 is brought into contact with the imprintable medium 106.

One manner in which the imprint template 120 may be brought to this location is by moving the template holder 122 using an actuator (not illustrated). The apparatus may be arranged such that once the raised patterned portion 123 of the imprint template 120 comes into contact with the droplets of imprintable medium 106, the imprint template 120 is released from the template holder 122. Once the imprint template 120 has been released from the template holder 122, it moves freely towards the substrate 100 driven by its own weight and/or by interfacial tension forces. The term "interfacial tension forces" refers to force arising from attractive forces acting within the imprintable medium 106. It is similar to surface tension, but unlike surface tension is not limited to a liquid in contact with a gas.

The movement of the imprint template 120 towards the substrate 100 continues until gas (e.g., air) which is located between the imprint template 120 and the substrate 100 has escaped. In an alternative arrangement, the template holder 122 may be released from the actuator instead of the releasing the imprint template 120 from the template holder 122.

The imprintable medium 106 has a meniscus around its outer perimeter, which is constrained by the anti-wetting material 104. The outer perimeter of the raised patterned portion 123 of the imprint template 120 is provided with a sharp edge 124. This is arranged so that the meniscus of the imprintable medium remains strongly attached to the imprint template raised patterned portion 123. Interfacial tension forces exerted by the meniscus of the imprintable medium act to displace the imprint template 120 in the x and y directions until the imprint template is in an equilibrium position in which it is substantially equidistant from the anti-wetting material. In some instances; the distances between the anti-wetting material 104 may be different in the x and y directions, with the result that the imprint template 120 is substantially equidistant from the anti-wetting material in the x-direction and is substantially equidistant (with a different distance) from the anti-wetting material in the y-direction.

FIG. 7 shows an example situation that will arise if the raised patterned portion 123 of the imprint template 120 is incorrectly located on the planarization layer 102 of substrate 100. A stretched meniscus 126 arises, and applies force which pulls the imprint template 120 and causes it to move laterally (i.e. across the surface of the substrate 100), in this case the movement being in the negative x-direction. Force continues to be exerted until the meniscus 126, and a meniscus which will be formed on a opposite side of the imprint template 120, reach an equilibrium state in which the forces applied cancel one another out.

Provided that the anti-wetting material 104 is correctly located, the raised patterned region 123 of the imprint template 120 will be correctly located on the substrate 100, for example with respect to a pattern which has previously been provided on the substrate. The embodiment of the invention therefore provides a technically simple and convenient manner in which the raised patterned region 123 of the imprint template 120 may be aligned to a pattern previously provided on a substrate.

Once a sufficient period of time has been allowed to elapse such that the imprint template 120 has reached an equilibrium position with respect to the stripes of anti-wetting material 104, actinic radiation is directed through the imprint template 120 and template holder 122 thereby curing the imprintable medium and fixing the imprinted pattern into the imprintable medium. The template holder 122 (or actuator) is then reconnected to the imprint template 120 (or template holder) and is used to remove the imprint template from the cured imprintable medium.

In some instances, the equilibrium position of the imprint template 120 may be found to be incorrect. Where this occurs, a laser may, for example, be used to burn away a portion of anti-wetting material 104, such that the equilibrium position of the imprint template 120 is adjusted.

It will be appreciated that the above-described method and apparatus may be provided for an array of imprint templates rather than for just a single imprint template.

In an embodiment, all original templates for one imprint template set are made using the same electron beam tool at substantially the same temperature (the temperature is tightly controlled). All replication steps needed to make a number of imprint templates required for parallel imprinting (i.e. imprinting more than one template simultaneously) are arranged to maintain the accuracy of the imprint template written by the electron beam tool. If correction is needed (because of dimensional changes of the substrate due to processing), this may be done by redefining the pattern(s) written by the electron beam tool.

Alignment apparatus, not illustrated, may be arranged to compare the locations of alignment marks provided on the imprint template 120 with alignment marks provided on the substrate 100, to ensure that the imprint template is correctly aligned before illumination with UV radiation is performed. It is not essential that alignment apparatus is used, since the alignment is automatically performed via the meniscus of the imprintable medium 106. The alignment apparatus may, for example, be used to obtain verification that alignment is being performed correctly.

As mentioned further above, references to illumination with UV radiation are not intended to exclude the use of other wavelengths of radiation where appropriate.

In the above described embodiment(s), the anti-wetting material is provided in a grid 102 on a substrate 100. It will be appreciated that the anti-wetting material may be provided in some other configuration. For example, it may not be necessary to entirely surround a target region 108 with anti-wetting material. The target region 108 may instead, for example, be at least partially surrounded by anti-wetting material, or may, for example, be substantially surrounded by anti-wetting material.

While references are made herein to moving the imprint template toward the substrate, it will be appreciated, and the embodiments of the invention encompass, that the substrate may be moved toward the imprint template or a combination of movement of both the imprint template and the substrate may be used.

While specific examples of the invention have been described above, it will be appreciated that the present invention may be practiced otherwise than as described. The description is not intended to limit the invention.

The invention claimed is:

1. A method of aligning an imprint template with respect to a target region of a substrate, the method comprising:
   contacting an imprint template to an imprintable medium within the target region so that the imprintable medium is compressed; and
   allowing the imprint template, the target region, or both, to move laterally with respect to each other under interfacial tension forces between the target region and the imprint template while the imprint template contacts the imprintable medium, wherein a material which is less wetting than the substrate is provided in a configuration which at least partially surrounds the target region of the substrate and comes into contact with the imprintable medium.

2. The method of claim 1, wherein the less wetting material is provided on the substrate with an accuracy better than 100 nm.

3. The method of claim 1, wherein the imprint template presses into the imprintable medium via the action of its own weight, interfacial tension forces arising from the imprintable medium, or both.

4. The method of claim 1, further comprising illuminating the imprintable medium with actinic radiation.

5. The method of claim 1, wherein the target region of imprintable medium is substantially surrounded by the less wetting material.

6. The method of claim 1, wherein the target region is one of a plurality of target regions on the substrate, and the less wetting material at least partially surrounds each of the plurality of target regions.

7. The method of claim 6, wherein the imprint template is one of a plurality of imprint templates, different imprint templates configured to be aligned with respective target regions on the substrate.

8. The method of claim 1, wherein the substrate includes a planarization layer that is wetting with respect to the imprintable material.

9. The method of claim 1, wherein the imprint template comprises a raised patterned area, the raised patterned area including an outer perimeter having a sharp edge.

10. The method of claim 1, wherein the target region is one of a plurality of target regions on the substrate, and the less wetting material substantially surrounds each of the plurality of target regions.

11. The method of claim 1, wherein the interfacial tension forces are surface tension forces.

12. A method of providing material on a substrate for use in imprint lithography, the material being less wetting than the substrate, the method comprising provided the substrate with a layer of polymer including a photo-acid generator, subsequent to said providing, illuminating selected areas of the substrate with actinic radiation, and reacting the layer of polymer with a silicon containing substance to form anti-wetting material in the selected areas.

13. The method of claim 12, wherein the polymer is poly (tert-butoxycarbonyl)- hydroxystyrene.

14. The method of claim 12, wherein the silicon containing substance is an alkyldimethyl (dimethylamino) silane or a fluorinated alkyldimethyl (dimethylamino) silane.

15. The method of claim 12, wherein the illuminating is performed using a laser writer, or using illumination through a photo-mask.

16. The method of claim 12, wherein the location of an edge of an area of anti-wetting material is adjusted by burning away some of the material using a laser.

* * * * *